(12) United States Patent
Yu

(10) Patent No.: US 7,852,631 B2
(45) Date of Patent: Dec. 14, 2010

(54) HEAT SINK ASSEMBLY

(75) Inventor: Ming Han Yu, Hsin Chuan (TW)

(73) Assignee: Asia Vital Components Co., Ltd., Hsin Chuan (TW)

( * ) Notice: Subject to any disclaimer, the term of this patent is extended or adjusted under 35 U.S.C. 154(b) by 55 days.

(21) Appl. No.: 12/326,313

(22) Filed: Dec. 2, 2008

(65) Prior Publication Data

US 2010/0134980 A1 Jun. 3, 2010

(51) Int. Cl.
*H05K 7/20* (2006.01)
*F28F 7/00* (2006.01)

(52) U.S. Cl. .................. 361/700; 165/104.33; 361/704

(58) Field of Classification Search .................. 361/700
See application file for complete search history.

(56) References Cited

U.S. PATENT DOCUMENTS

| | | | |
|---|---|---|---|
| 7,082,032 B1 * | 7/2006 | Barsun et al. ............... 361/703 |
| 7,443,677 B1 * | 10/2008 | Zhou et al. ................... 361/702 |
| 7,637,311 B2 * | 12/2009 | Zheng et al. ................ 165/80.3 |
| 2006/0144567 A1 * | 7/2006 | Zhu et al. .............. 165/104.29 |
| 2008/0055854 A1 * | 3/2008 | Zhou et al. ................... 361/700 |
| 2008/0121371 A1 * | 5/2008 | Zhou et al. ................... 165/80.3 |
| 2008/0137301 A1 * | 6/2008 | Huang et al. ................ 361/700 |
| 2008/0156460 A1 * | 7/2008 | Hwang et al. .............. 165/80.3 |
| 2009/0080160 A1 * | 3/2009 | Wu ............................. 361/704 |

* cited by examiner

*Primary Examiner*—Gregory D Thompson

(57) ABSTRACT

A heat sink assembly comprises a base consisting of an aluminum casting and a copper base plate, a heat sink consisting of heat fins, and at least a heat guide pipe; the heat guide pipe has a heat dissipation section passing through the heat fins; the aluminum casting has a hollow receiving space accommodating the copper base plate, and an elongated recess is disposed at the top sides of the copper base plate and the casting for placing the heat conduction part of the heat guide pipe; the copper base plate keeps contact the heat source and the heat transmits to the heat guide pipe and then is dissipated with the heat sink via the base rapidly. In addition, the weight of the heat sink assembly is decreased, and the manufacturing cost is reduced.

1 Claim, 4 Drawing Sheets

HEAT SINK ASSEMBLY

BACKGROUND OF THE INVENTION

1. Field of Invention

The present invention relates to a heat sink assembly. More particularly, the present invention relates to a heat sink assembly comprising a heat base made of copper and aluminum, and further in coordination with the heat structure of a heat guide and a heat sink comprising a plurality of heat fins, which effectively achieves a best heat dissipation effect.

2. Description of Related Art

With the rapid development of the electronic science and technology industry, the electronic devices are required to operate at a higher speed. To ensure the normal operation of the electronic devices and prolong their life time, the heat dissipation treatment of the electronic device appears more and more important, and is highlighted for special attention. Therefore, various heat dissipation products corresponding to different application fields are developed to meet the demands of the market.

FIG. 1 shows a conventional heat sink assembly, which uses a heat pipe and heat fins for heat dissipation. The heat sink assembly (100) comprises a heat pipe (110) welded into a slot (122) in a base (120) so that the heat transfer part (110a) is in well contact with the base (120). In addition, the heat pipe (110) is provided with a group of fins (130) at the heat dissipation part (110b), wherein said fins (130) are welded to the heat pipe (110) so that the heat generated in the electronic device can be transferred from the base to the heat pipe and finally dissipated from the fins (130).

However, in such a conventional structure, the base (120) is made of copper material only and thus it is heavy in weight, which increases the total weight of the electronic device where it is applied. In addition, the manufacturing cost is relatively high due to the high price of the copper.

To solve the above mentioned problems in the conventional art, the present invention is proposed to reduce the reject ratio of raw material, increase the yield and throughput of the heat sink assembly and reduce the manufacturing cost of the product, thus increasing the competitiveness of the product. The present inventor has actively done further analysis and research on the defects of existing conventional heat sink assembly, and thus established the present invention. The heat sink assembly of the present invention has the advantages of being easier to assemble and rendering a better heat dissipation effect at a lower cost.

SUMMARY OF THE INVENTION

Accordingly, the present invention is directed to provide a heat sink assembly having improved heat dissipation effect at a low cost, which has a reduced weight and is easy to assemble.

A heat sink assembly of the present invention is characterized by comprising a base consisting of an aluminum casting and a copper base plate, a heat sink consisting of a plurality of aluminum heat fins, and at least a heat guide, wherein at least a groove is provided on each of the plurality of heat fins according to the quantity of said heat guide for passing the dissipation part of each said at least a heat guide, a cavity is opened on said aluminum casting for said copper base plate housing, and at least a trough is formed on the top surfaces of said copper base plate and said aluminum casting for placing the heat conduction part of each said at least a heat guide. Said copper base plate is placed against the heat source to transfer the heat through said base to said heat guide and then to said heat sink, so that the heat can be dissipated rapidly through said plurality of heat fins. In addition, the manufacturing cost and the total weight of the heat sink assembly are reduced.

In order to make the aforementioned and other objects, features and advantages of the present invention comprehensible, a preferred embodiment accompanied with figures is described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
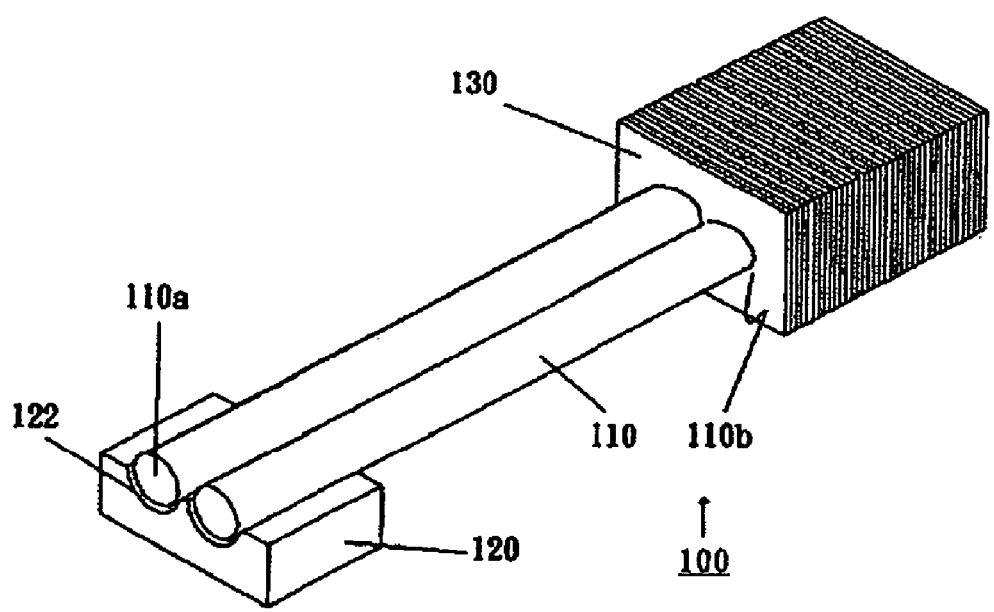
FIG. 1 shows a conventional heat sink assembly.
Figure 2:
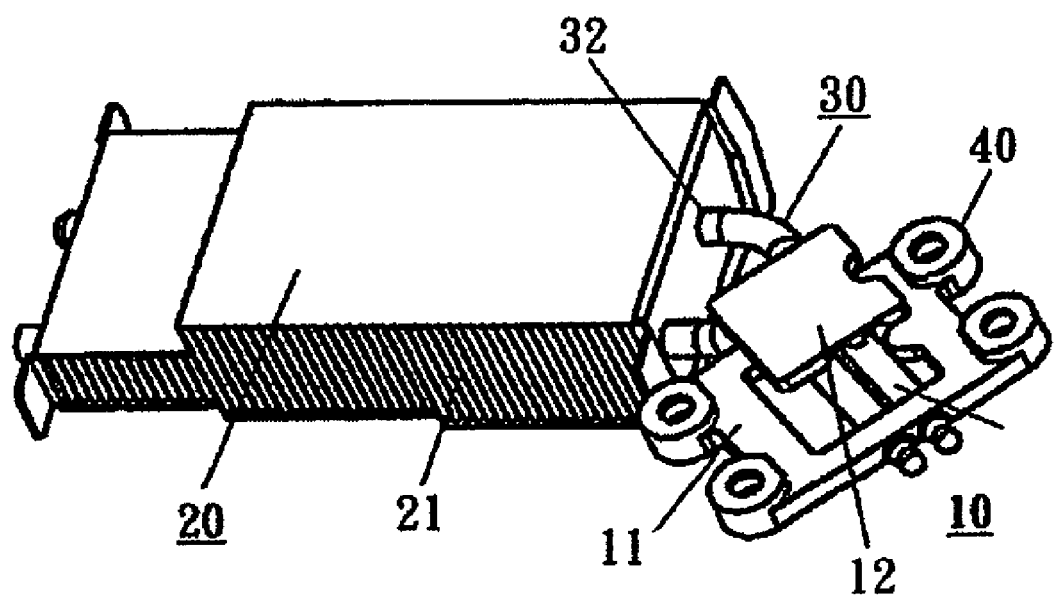
FIG. 2 is a perspective view of the heat sink assembly to the present invention with the copper base plate 12 being detached.
Figure 3A:
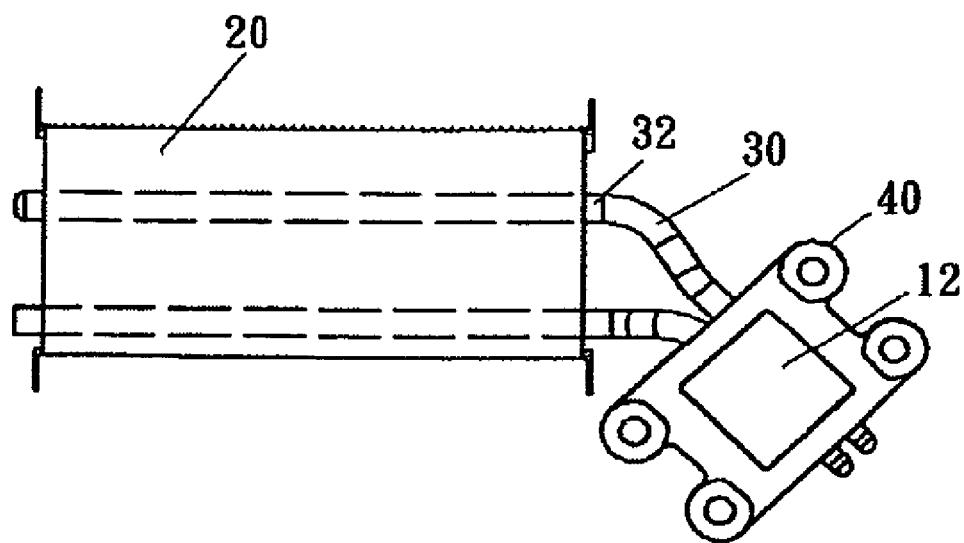
FIG. 3A is a bottom view of the assembly according to the present invention.
Figure 3B:
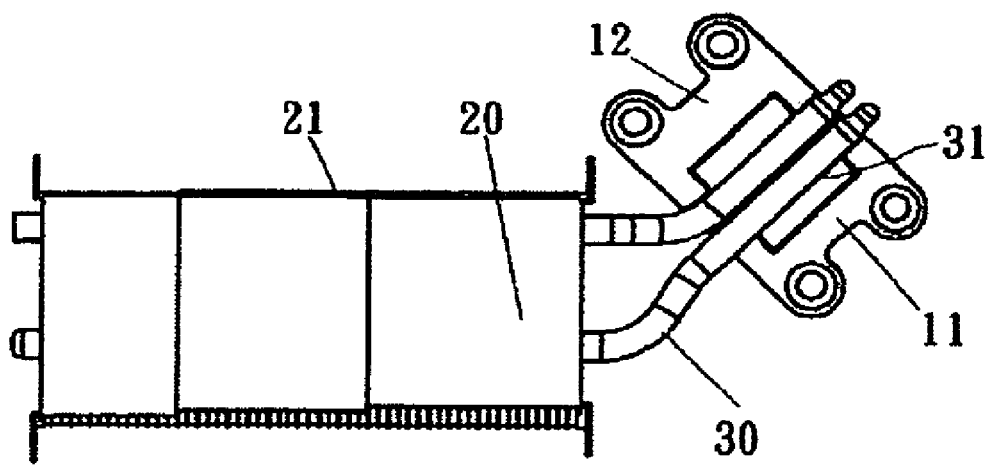
FIG. 3B is a top view of the assembly according to the present invention.
Figure 4:
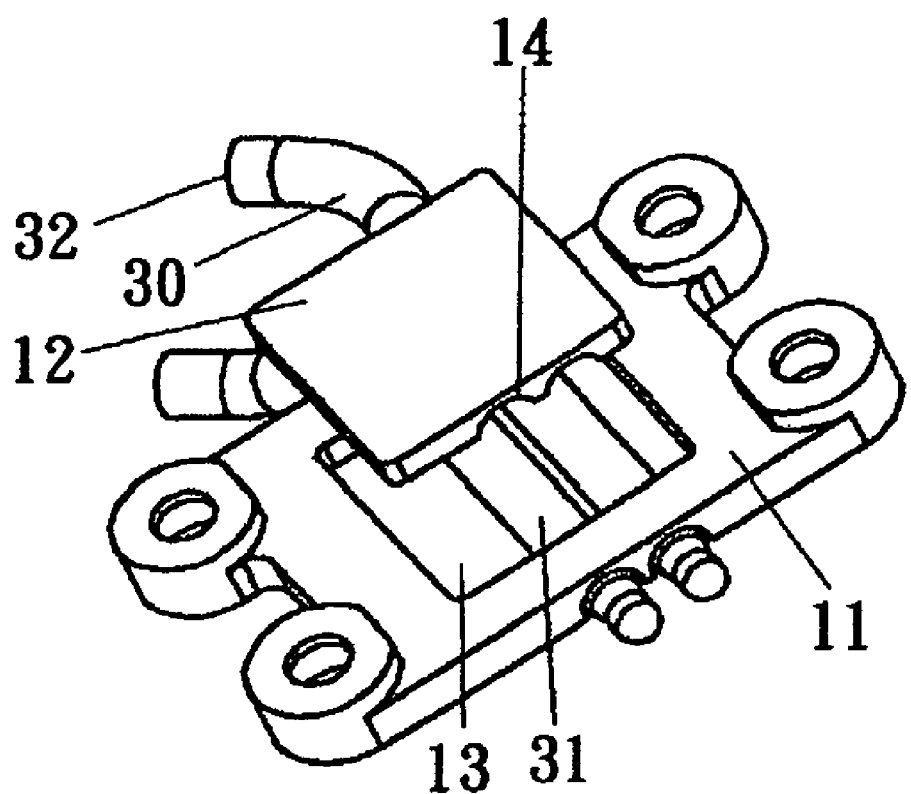
FIG. 4 is an enlarged perspective view of the base 10 shown in FIG. 2.

Referring to FIGS. 2, 3A, 3B and 4, the heat sink assembly of the present invention comprises a base (10) consisting of an aluminum casting (11) and a copper base plate (12), a heat sink (20) consisting of a plurality of heat fins (21), and at least a heat guide (30), wherein at least a through hole is provided at each of the heat fins (21) according to the quantity of said heat guide pipe (30) for the heat dissipation section (32) of each heat guide pipe (30) passing through, a hollow receiving space (13) is disposed in the middle of the aluminum casting (11) for fitting with the copper base plate (12), and at least an elongated recess (14) is disposed at the upper sides of said copper base plate (12) and said aluminum casting (11). The elongated recess (14) goes across the top sides of the copper base plate (12) and the aluminum casing (11), and extends to two opposite sides of aluminum casting (11) for placing the heat conduction part (31) the heat guide pipe (30), and said copper base plate (12) is placed against the heat source to transfer the heat to said guide pipe (30) via the base (10) and then to said heat sink (20), so that the heat can be dissipated rapidly through said plurality of heat fins (21). According to the present invention, the heat guide pipe (30) can be secured to the aluminum casting with set screws. Compared with the traditional copper base structure, said base (10) of the present invention is consisting of the aluminum casting (11) and the copper base plate (12), which ameliorate the defect of the overweight of the whole heat sink assembly and reduces the manufacturing cost.

Above all, the heat sink assembly of the present invention has a simpler structure and provides a better heat dissipation effect. Compared with the conventional technology, the present invention has the following advantages:

i. The heat sink assembly of the present invention achieves heat dissipation transferring the heat from the base which is consisting of an aluminum casting (11) and a copper base plate (12) to a heat sink consisting of a plurality of heat fins, so that the heat can be fully dissipated.

ii. The heat sink assembly of the present invention uses the aluminum material in combination with the copper, which reduces the weight of the whole assembly effectively and reduces the manufacturing cost.

iii. The heat sink assembly of the present invention improves the product yield and throughput, thus enhancing the competitiveness in the market.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A heat sink assembly comprising:
   a base consisting of an aluminum casting and a copper base plate, the aluminum casing having a first facial side and the copper base plate having a second facial side;
   a heat sink being disposed beside and apart from the base, and consisting of a plurality of aluminum heat fins; and
   at least a heat guide pipe having a first end and a second end, providing a heat dissipation section next to the first end and a heat conduction section next to the second end, the heat dissipation section passing through the aluminum heat fins,
   wherein a hollow receiving space is disposed in the middle of said aluminum casting to fit with said copper base plate, and an elongated recess is disposed at the second facial side and extends to two opposite lateral sides of the first facial side to place the heat conduction section;
   whereby, said copper base plate closely contacts a heat source, and heat from the heat source is transmitted to said heat sink via the base and the heat guide pipe successively to enhance the heat dissipation effect.

* * * * *